United States Patent
Bhargava et al.

(10) Patent No.: US 10,002,665 B1
(45) Date of Patent: Jun. 19, 2018

(54) MEMORY DEVICES FORMED FROM CORRELATED ELECTRON MATERIALS

(71) Applicant: ARM Ltd., Cambridge (GB)

(72) Inventors: Mudit Bhargava, Austin, TX (US); Piyush Agarwal, Noida (IN); Akshay Kumar, New Delhi (IN); Glen Arnold Rosendale, Austin, TX (US)

(73) Assignee: ARM Ltd., Cambridge (GB)

( * ) Notice: Subject to any disclaimer, the term of this patent is extended or adjusted under 35 U.S.C. 154(b) by 0 days. days.

(21) Appl. No.: 15/480,177

(22) Filed: Apr. 5, 2017

(51) Int. Cl.
G11C 11/00 (2006.01)
G11C 13/00 (2006.01)

(52) U.S. Cl.
CPC ...... G11C 13/0097 (2013.01); G11C 13/0004 (2013.01); G11C 13/004 (2013.01); G11C 13/0007 (2013.01); G11C 13/0011 (2013.01); G11C 13/0061 (2013.01); G11C 13/0069 (2013.01)

(58) Field of Classification Search
CPC ............. G11C 13/0097; G11C 13/004; G11C 13/0007; G11C 13/0004; G11C 13/0069; G11C 13/0061; G11C 13/0011
USPC ........................................................ 365/148
See application file for complete search history.

(56) References Cited

U.S. PATENT DOCUMENTS

| | | | |
|---|---|---|---|
| 7,298,640 B2 | 11/2007 | Chen et al. | |
| 7,466,584 B1 * | 12/2008 | Parkinson | G11C 8/10 365/148 |
| 7,639,523 B2 | 12/2009 | Celinska et al. | |
| 7,778,063 B2 | 8/2010 | Brubaker et al. | |
| 7,872,900 B2 | 1/2011 | Paz De Araujo et al. | |
| 9,558,819 B1 | 1/2017 | Aitken et al. | |
| 9,584,118 B1 | 2/2017 | Dao et al. | |
| 9,589,636 B1 | 3/2017 | Bhavnagarwala et al. | |
| 9,627,615 B1 | 4/2017 | Reid et al. | |
| 2008/0106926 A1 | 5/2008 | Brubaker | |
| 2008/0107801 A1 | 5/2008 | Celinska et al. | |
| 2009/0116280 A1 * | 5/2009 | Parkinson | G11C 13/0004 365/163 |
| 2013/0200323 A1 | 8/2013 | Pham et al. | |
| 2013/0214232 A1 | 8/2013 | Tendulkar et al. | |
| 2013/0285699 A1 | 10/2013 | McWilliams et al. | |
| 2016/0163978 A1 | 6/2016 | Paz De Araujo et al. | |
| 2017/0033782 A1 | 2/2017 | Shifren | |
| 2017/0045905 A1 | 2/2017 | Sandhu et al. | |
| 2017/0047116 A1 | 2/2017 | Sandhu et al. | |
| 2017/0047919 A1 | 2/2017 | Sandhu et al. | |
| 2017/0069378 A1 | 3/2017 | Shifren et al. | |

* cited by examiner

*Primary Examiner* — Thao H Bui
(74) *Attorney, Agent, or Firm* — Berkeley Law & Technology Group, LLP

(57) ABSTRACT

Subject matter provided may relate to devices, such as conducting elements, which operate to place correlated electron switch elements into first and second impedance states. In embodiments, conducting elements are maintained to be at least partially closed continuously during first and second phases of coupling the CES elements between a common source voltage and a corresponding bitline.

21 Claims, 6 Drawing Sheets

MEMORY DEVICES FORMED FROM CORRELATED ELECTRON MATERIALS

BACKGROUND

Field

This disclosure relates to devices formed from correlated electron materials (CEMs), and may relate, more particularly, to memory devices formed from switching elements that comprise CEMs.

Information

Non-volatile memories are a class of memory in which the memory cell or element maintains its state after power supplied to the device is removed. One type of non-volatile memory in use today includes electrically programmable read-only memory (EEPROM) devices, for example. However, EEPROM devices may comprise relatively large cell areas and may require a large voltage (e.g., from 12.0 to 21.0 volts) on a transistor gate to perform writing or erasing operations. Further, EEPROMs may be limited to no more than 1 million erase/write cycles.

Recently, FeRAMs (Ferroelectric RAMs) have been introduced to provide low power, relatively high write/read speed, and increased endurance with respect to read/write cycles, exceeding 10 billion of such cycles. Likewise, magnetic memories (MRAMs) have been introduced to provide high write/read speed and endurance, but with a higher cost and power consumption premium. Further, neither of these technologies have reached the density of flash memory devices, for example. As such, flash remains a non-volatile memory of choice. Nevertheless, it is generally recognized that flash memory technology may not scale easily below 65 nanometers (nm); thus, new non-volatile memory devices capable of being scaled to smaller sizes are actively being sought.

A category of variable resistance memories includes materials that respond to an initial "forming" voltage and current to give rise to a variable resistance function. These materials may include, for example, $Pr_xCa_yMn_zO_\epsilon$, with x, y, z and $\epsilon$ of varying stoichiometry; transition metal oxides, such as CuO, CoO, $VO_x$, NiO, $TiO_2$, $Ta_2O_5$; and some perovskites, such as Cr; $SrTiO_3$. Several of these memory types exist, falling into the resistive RAMs (ReRAMs) or conductive bridge RAMS (CBRAM) classification, which distinguishes these memory types from chalcogenide type memories. Since operation of a ReRAM/CBRAM appears to be strongly temperature dependent, a resistive switching mechanism in a ReRAM/CBRAM may also be highly temperature dependent. Additionally, these systems may operate stochastically based, at least in part, on the stochastic process of forming a conductive filament, which brings about one of the device's binary states. However, over time, resistance switching in ReRAM/CBRAMs tends to fatigue, which brings about changes between conductive and insulative states of these memory devices. In a commercial memory device, such a change may render these types of devices unusable.

Given an inherent difficulty in forming a thin film resistance switching material that is stable over time and temperature, a workable resistance switching memory remains a challenge. Furthermore, resistance-switching mechanisms developed up to now appear to be inherently unsuitable for memories, due to high currents, electroforming, no measurable memory read or write windows over a reasonable range of temperatures and voltages, and many other problems. Thus, there remains a need in the art for a non-volatile memory that does not rely on stochastic behavior of a material, consumes low power, permits high-speed operation, as well as high density and stability, and in particular, is scalable to feature sizes well below 65 nanometers.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1A:
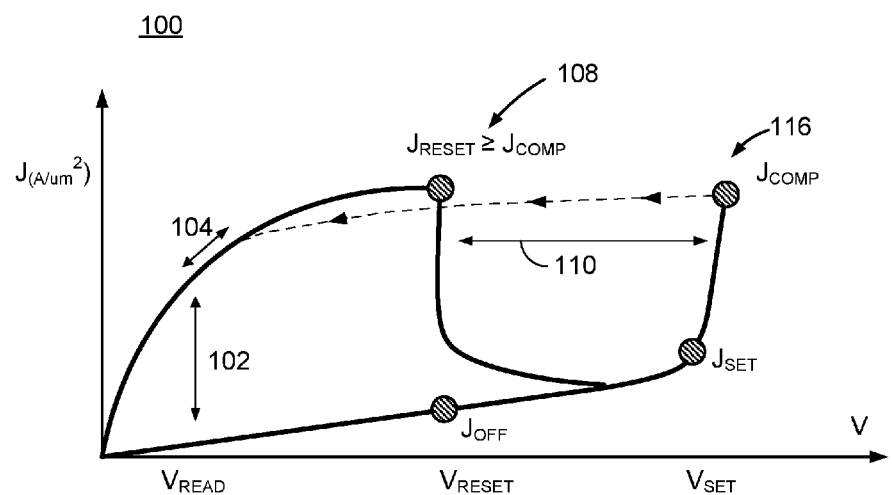
FIG. 1A is a graphical representation of voltage versus current density for a correlated electron switch (CES) element according to an embodiment.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

Particular aspects of the present disclosure describe methods and/or processes for preparing, fabricating, and/or operating CEM devices, such as CES elements, and/or other circuit elements, such as may be utilized to form a memory element comprising a CEM, for example, in a series arrangement with a conducting element, such as a field effect transistor (FET). CEMs, which may be utilized in the construction memory system comprising CES elements, for example, may also comprise a wide range of other electronic circuit types, such as, for example, memory access devices, memory controllers, memory arrays, filter circuits, data converters, optical instruments, phase locked loop circuits, microwave and millimeter wave components, and so forth, although claimed subject matter is not limited in scope in these respects. In this context, a CEM device, such as a CES element, for example, may exhibit a substantially rapid conductor-to-insulator transition, which may be brought about by electron correlations rather than by solid state structural phase changes, such as in response to a change from a crystalline to an amorphous state, for example, in a phase change memory device. In one aspect, a substantially rapid conductor-to-insulator transition in a CES element may be responsive to a quantum mechanical phenomenon, in contrast to melting/solidification or filament formation, for example, in phase change memory devices. Such quantum mechanical transitions between relatively conductive and relatively insulative states, and/or between first and second impedance states, for example, in a CES element may be understood in any one of several aspects. As used herein, the terms "relatively conductive state," "relatively lower impedance state," and/or "metal state" may be interchangeable, and/or may, at times, be referred to as a "relatively conductive/lower impedance state." Similarly, the terms "relatively insulative state" and "relatively higher impedance state" may be used interchangeably herein, and/or may, at times, be referred to as a "relatively insulative/higher impedance state."

In an aspect, a quantum mechanical transition of a correlated electron material between a relatively insulative/higher impedance state and a relatively conductive/lower impedance state, wherein the relatively conductive/lower impedance state is substantially dissimilar from the insulated/higher impedance state, may be understood in terms of a Mott transition. In accordance with a Mott transition, a material may transition (e.g., turn-on) from a relatively insulative/higher impedance state to a relatively conductive/lower impedance state if a Mott transition condition occurs. The Mott criteria may be defined by $(n_c)^{1/3}a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CES element changes from a relatively higher resistance/higher capacitance state (e.g., an insulative/higher impedance state) to a relatively lower resistance/lower capacitance state (e.g., a conductive/lower impedance state) that is substantially dissimilar from the higher resistance/higher capacitance state.

In another aspect, the Mott transition may be controlled by a localization of electrons. If carriers, such as electrons, for example, are localized, a strong coulomb interaction between the carriers is believed to split the bands of the CEM formed within the CES element to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

Further, in an embodiment, a transition from a relatively insulative/higher impedance state to a substantially dissimilar and relatively conductive/lower impedance state may bring about a change in capacitance in addition to a change in resistance. For example, a CES element may exhibit a variable resistance together with a property of variable capacitance. In other words, impedance characteristics of a CES element may include both resistive and capacitive components. For example, in a metal state, a CES element may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating the CES element and, therefore, the CES element may comprise higher capacitance based, at least in part, on additional charges stored within the CEM. Thus, for example, a transition from a relatively insulative/higher impedance state to a substantially dissimilar and relatively conductive/lower impedance state in a CES element may result in changes in both resistance and capacitance, at least in particular embodiments. Such a transition may bring about additional measurable phenomena, and claimed subject matter is not limited in this respect.

In particular implementations of aspects of this disclosure, a memory element may comprise: a conducting element coupled in series to a CES element; a write driver circuit for placing the CES element into a first resistive state or a second resistive state based, at least in part, on signals provided to the CES element, wherein a resistance of the CES element is higher in the second resistance state than in the first resistance state; and a read circuit for sensing the state of the memory cell and providing an electrical signal corresponding to the sensed state of the memory cell. In one aspect, a resistance of a CES in the second memory cell state may be more than about 100 times the resistance in the second memory cell state. In a particular implementation, a CES element may switch resistive states responsive to a Mott-transition in the majority of the volume of the CES element. In one aspect, a CES device may comprise a material selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

In implementations, a CES element may comprise one or more "d-block" elements from the periodic table of the elements, such as transition metals, transition metal compounds, one or more transition metal oxides (TMOs), for example. CES elements may also be implemented utilizing one or more "f-block" elements of the periodic table of the elements, such as rare earth elements, oxides of rare earth elements, oxides comprising one or more rare earth transitional metals, perovskites, yttrium, and/or ytterbium, or any other compounds comprising metals from the lanthanide or actinide series of the periodic table of the elements, for example, and claimed subject matter is not limited in scope in this respect. Accordingly, in embodiments, a CEM that forms a CES element may comprise oxides of one or more d-block elements and/or oxides of one or more f-block elements, having an atomic concentration of at least 85.0%, for example, with the remaining portion of the CEM that forms the CES element comprising a dopant such as, for example, carbon or nitrogen. Thus, in this context, as the term is used herein, a d-block element means an element comprising Scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), hafnium (Hf), tantalum (Ta), tungsten (W), rhenium (Re), osmium (Os), iridium (Ir), platinum (Pt), gold (Au), mercury (Hg), rutherfordium (Rf), dubnium (Db), seaborgium (Sg), bohrium (Bh), hassium (Hs), meitnerium (Mt), darmstadtium (Ds), roentgenium (Rg) or copernicium (Cn), or any combination thereof. Also in this context, a CES element formed from or comprising an "f-block" element of the periodic table of the elements means a CES element comprising a metal or metal oxide from f-block of the periodic table of the elements, which includes lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), actinium (Ac), thorium (Th), protactinium (Pa), uranium (U), neptunium (Np), plutonium (Pu), americium (Am), berkelium (Bk), californium (Cf), einsteinium (Es), fermium (Fm), mendelevium (Md), nobelium (No) or lawrencium (Lr), or any combination thereof.

In a particular embodiment, a CES element may be formed as a correlated electron random access memory (CERAM) device. In this context, a CERAM device comprises a material that may transition between or among a plurality of predetermined detectable memory states based, at least in part, on a transition of at least a portion of the material between a conductive state and an insulative state utilizing the quantum mechanical Mott transition. In this context, a "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed into a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive and insulative memory states. As discussed in the particular example implementations below, material of a CES element sandwiched between conductive terminals may be placed into an insulative or higher impedance memory state by application of a first programming signal across the terminals having a voltage $V_{RESET}$ and current $I_{RESET}$, or placed into a conductive or low impedance memory state by application of a second programming signal across the terminals having a voltage $V_{SET}$ and current $I_{SET}$. In this context, it should be understood that terms such as "conductive or low impedance" memory state and "insulative or high impedance" memory state are relative terms and not specific to any particular quantity or value for impedance or conductance. For example, while a memory device is into a first memory state referred to as an insulative or high impedance memory state the memory device in one aspect is less conductive (or more insulative) than while the memory device in a second memory state referred to as a conductive or low impedance memory state.

In a particular implementation, CERAM memory cells may comprise a metal/CEM/metal (M/CEM/M) stack formed on a semiconductor. Such an M/CEM/M stack may be formed on a diode, for example. In an example, implementation, such a diode may be selected from the group consisting of a junction diode and a Schottky diode. In this context, it should be understood that "metal" means a conductor, that is, any material that acts like a metal, including, for example, polysilicon or a doped semiconductor.

FIG. 1A is a graphical representation of voltage versus current density for a correlated electron switch (CES) element according to an embodiment 100. Based, at least in part, on a voltage applied to terminals of the CES element (e.g., in a write operation), the CES element may be placed into a conductive state or an insulative state. For example, application of a voltage $V_{SET}$ and current density $J_{SET}$ may place the CES element in a conductive memory state and application of a voltage $V_{RESET}$ and a current density $J_{RESET}$ may place the CES element in an insulative memory state. Following placement of the CES element in an insulative state or conductive memory state, the particular state of the CES element may be detected by application of a voltage $V_{READ}$ (e.g., in a read operation) and detection of a current or current density at terminals of the CERAM element.

In accordance with FIG. 1A, if a voltage signal at a sufficient level is applied (e.g., exceeding a band-splitting potential) and the aforementioned Mott condition is satisfied (e.g., injected electron holes are of a population comparable to a population of electrons in a switching region, for example), a CES element may transition from a relatively low-impedance state to a relatively high-impedance state. This may correspond to point 108 of the voltage versus current density profile of FIG. 1A. At, or suitably near this point, electrons are no longer screened and become localized near metal ions comprising the CEM. This correlation may result in a strong electron-to-electron interaction potential, which may operate to split the bands to form a relatively high-impedance material. If the CES element comprises a relatively high-impedance state, current may be generated by transportation of electron holes. In certain embodiments, injection of a threshold current of electrons, at a threshold potential applied across terminals of a CES element, may perform a "set" operation, which places the CES element into a low-impedance state. In a low-impedance state, an increase in electrons may screen incoming electrons and remove a localization of electrons, which may operate to collapse the band-splitting potential, thereby giving rise to the low-impedance state.

According to an embodiment, current in a CES element may be controlled by an externally applied "compliance" condition, which may be determined at least partially on the basis of an applied external current, which may be limited during an operation to place the CES element into a relatively high-impedance state. This externally applied compliance current may, in some embodiments, also set a condition of a current density for a subsequent reset operation to place the CES element into a relatively high-impedance state. As shown in the particular implementation of FIG. 1A, a current density $J_{COMP}$, which may be applied during an operation at point 116 to place the CES element into a relatively low-impedance state, may determine a compliance condition for placing the CES element into a high-impedance state in a subsequent operation. As shown in FIG. 1A, the CES element may be subsequently placed into a high-impedance state by application of a current density $J_{RESET} \geq J_{COMP}$ at a voltage $V_{RESET}$ at point 108, at which $J_{COMP}$ is externally applied.

The compliance condition therefore may determine a number of electrons in a CES device that are to be "captured" by holes for the Mott transition. In other words, a current applied in a write operation to place a CES device in a conductive memory state may determine a number of holes to be injected to the CES device for subsequently transitioning the CES device to an insulative memory state.

As pointed out above, a reset condition may occur in response to a Mott transition at point 108. As pointed out above, such a Mott transition may bring about a condition in a CES element in which a concentration of electrons n approximates, or becomes at least comparable to, a concentration of electron holes p. This condition may be modeled substantially in accordance with expression (1) as follows:

$$\lambda_{TF} n^{\frac{1}{3}} = C \sim 0.26 \qquad (1)$$

$$n = \left(\frac{C}{\lambda_{TF}}\right)^3$$

In expression (1), $\lambda_{TF}$ corresponds to a Thomas Fermi screening length, and C is a constant.

According to an embodiment, a current or current density in region 104 of the voltage versus current density profile shown in FIG. 1A, may exist in response to injection of holes from a voltage signal applied across terminals of a CES element. Here, injection of holes may meet a Mott transition criterion for the low-impedance state to high-impedance state, referred to as a Mott-like transition, at current $I_{MI}$ as a threshold voltage $V_{MI}$ is applied across terminals of a CES element. This may be modeled substantially in accordance with expression (2) as follows:

$$I_{MI}(V_{MI}) = \frac{dQ(V_{MI})}{dt} \approx \frac{Q(V_{MI})}{t} \qquad (2)$$

$$Q(V_{MI}) = qn(V_{MI})$$

Wherein $Q(V_{MI})$ corresponds to the injected carriers (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled substantially in accordance with expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \qquad (3)$$

$$J_{reset}(V_{MI}) = J_{MI}(V_{MI}) = \frac{I_{MI}(V_{MI})}{A_{CEM}} = \frac{q}{A_{CEM} t} = \frac{q}{A_{CEM} t}\left(\frac{C}{\lambda_{TF}}\right)^3$$

In which $A_{CEM}$ is a cross-sectional area of a CES element that; and $J_{RESET}(V_{MI})$ may represent a current density through the CES element to be applied to the CES element at a threshold voltage $V_{MI}$, which may place the CES element into a high-impedance or insulative state.

According to an embodiment, the CES element characterized in FIG. 1A, and in other figures herein, may comprise any transition metal oxide (TMO), such as, for example, perovskites, Mott insulators, charge exchange insulators, and Anderson disorder insulators. In particular implementations, a CES element may be formed from switching materials, such as nickel oxide, cobalt oxide, iron oxide, yttrium oxide, titanium yttrium oxide, and perovskites, such as chromium doped strontium titanate, lanthanum titanate, and the manganate family including praseodymium calcium manganate, and praseodymium lanthanum manganite, just to provide a few examples. In particular, oxides incorporating elements with incomplete "d" and "f" orbital shells, such as those listed above, may comprise sufficient impedance switching properties for use in a CES element. Other implementations may employ other transition metal compounds without deviating from claimed subject matter.

In one aspect, the CES elements characterized in FIG. 1A, and in other figures herein, may comprise other types of transition metal oxide variable impedance materials, though it should be understood that these are exemplary only and are not intended to limit claimed subject matter. Nickel oxide (NiO) is disclosed as one particular TMO. NiO materials discussed herein may be doped with extrinsic ligands, such as carbonyl (CO), which may establish and/or stabilize variable impedance properties and/or bring about a P-type operation in which a CEM formed within a CES element may be more conductive in a low-impedance state (e.g., region 104 of FIG. 1A). Thus, in another particular example, NiO doped with extrinsic ligands may be expressed as $NiO:L_x$, where $L_x$ may indicate a ligand element or compound and x may indicate a number of units of the ligand for one unit of NiO. A value of x may be determined for any specific ligand and any specific combination of ligand with NiO or with any other transition metal compound simply by balancing valences. Other dopant ligands, which may bring about or enhance conductivity in a low-impedance state in addition to carbonyl may include: nitrosyl (NO), triphenylphosphine (PPH$_3$), phenanthroline (C$_{12}$H$_8$N$_2$), bipyridine (C$_{10}$H$_8$N$_2$), ethylenediamine (C$_2$H$_4$(NH$_2$)$_2$), ammonia (NH$_3$), acetonitrile (CH$_3$CN), Fluoride (F), Chloride (Cl), Bromide (Br), cyanide (CN), sulfur (S), and others.

In transitioning a CES to a conductive memory state, as enough electrons have been injected and the potential across terminal of the CES device overcomes a critical switching potential (e.g., V$_{SET}$), injected electrons begin to screen and unlocalize double-occupied electrons to reverse a disproportion reaction and closing the bandgap. A current density $J_{SET}(V_{MI})$ for transitioning the CES to the conductive memory state at a critical voltage V$_{MI}$ enabling transition to the conductive memory state may be expressed according to expression (4) as follows:

$$I_{MI}V_{MI} = \frac{dQ(V_{MI})}{dt} \approx \frac{Q(V_{MI})}{t} \quad (4)$$

$$Q(V_{MI}) = qn(V_{MI})$$

$$I_{MI}(V_{MI}) = \frac{Q(V_{MI})}{t} = \frac{qn(V_{MI})}{t} = \frac{q}{t}\left(\frac{C}{a_B}\right)^3$$

$$J_{SET}(V_{MI}) = J_{injection}(V_{MI}) = J_{MI}(V_{MI}) = \frac{I_{MI}(V_{MI})}{A_{CERAM}} = \frac{q}{A_{CERAM}t}\left(\frac{C}{a_B}\right)$$

where a$_B$ corresponds to a Bohr radius.

According to an embodiment, a "read window" 102 for detecting a memory state of a CES device in a read operation may be set out as a difference between a portion 106 the plot of FIG. 1A while the CES device is in an insulative state and region 104 of the plot FIG. 1A while the CES device is in a conductive state at a read voltage V$_{READ}$. In a particular implementation, read window 102 may be used to determine a Thomas Fermi screening length A$_{TF}$ of material making up the CES device. For example, at a voltage V$_{RESET}$, current densities J$_{RESET}$ and J$_{SET}$ may be related to according to expression (5) as follows:

$$\lambda_{TF}(@V_{RESET}) = a_B\left(\frac{J_{SET}}{J_{OFF}}\right)^{\frac{1}{3}} \quad (5)$$

In another embodiment, a "write window" 110 for placing a CES device into an insulative or conductive memory state in a write operation may be set out as a difference between V$_{RESET}$ (at J$_{RESET}$) and V$_{SET}$ (at J$_{SET}$). Establishing |V$_{SET}$|>|V$_{RESET}$| enables a switch between conductive and insulative state. V$_{RESET}$ may approximate a band splitting potential arising from correlation and V$_{SET}$ may approximate twice the band splitting potential. In particular implementations, a size of write window 110 may be determined, at least in part, by materials and doping of the CES device.

Figure 1B:
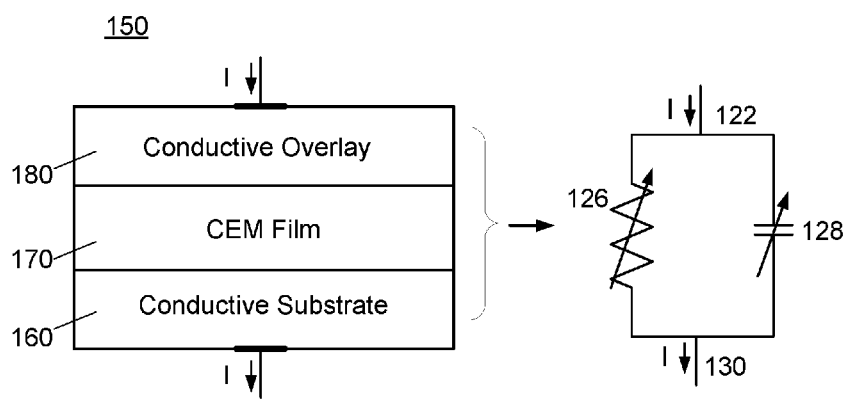
FIG. 1B is a schematic diagram of an equivalent circuit of a CES element according to an embodiment.

The transition from high resistance/capacitance to low resistance/capacitance in a CES element may be represented by a singular impedance of the CES element. FIG. 1B is an illustration of an embodiment 150 of an equivalent circuit of the CES switching element. As previously mentioned, a CEM switch, a CEM-based diode, CES elements of a CERAM memory or other type of device utilizing one or more correlated electron materials may comprise a variable or complex impedance device that may comprise characteristics of both variable resistance and variable capacitance. In other words, impedance characteristics for a CES variable impedance element, such as a device comprising a metallic electrode 160, CEM 170, and conductive overlay 180, may depend at least in part on resistance and capacitance characteristics of the device if measured across device terminals 122 and 130. In an embodiment, an equivalent circuit for a variable impedance device may comprise a variable resistor, such as variable resistor 126, in parallel with a variable capacitor, such as variable capacitor 128. Of course, although a variable resistor 126 and variable capacitor 128 are depicted in FIG. 1B as comprising discrete components, a variable impedance device, such as device of embodiment 150, may comprise a substantially homogenous CEM and claimed subject matter is not limited in this respect.

Table 1, below, depicts an example truth table for an example variable impedance device, such as the device of embodiment 150.

TABLE 1

Correlated Electron Switch Truth Table

| Resistance | Capacitance | Impedance |
|---|---|---|
| R$_{high}$(V$_{applied}$) | C$_{high}$(V$_{applied}$) | Z$_{high}$(V$_{applied}$) |
| R$_{low}$(V$_{applied}$) | C$_{low}$(V$_{applied}$)~0 | Z$_{low}$(V$_{applied}$) |

In an embodiment, Table 1 shows that a resistance of a variable impedance device, such as the device of embodiment 150, may transition between a low-impedance state and a substantially dissimilar, high-impedance state as a function at least partially dependent on a voltage applied across a CES element. In an embodiment, an impedance exhibited at a low-impedance state comprise a value approximately in the range of 10.0 to 100,000.0 times lower than an impedance exhibited in a high-impedance state. In other embodiments, an impedance exhibited at a low-impedance state comprise a value approximately in the range of 5.0 to 10.0 times lower than an impedance exhibited in a high-impedance state, for example. It should be noted, however, that claimed subject matter is not limited to any particular impedance ratios between high-impedance states and low-impedance states. Table 1 shows that a capacitance of a variable impedance device, such as the device of embodiment 150, may transition between a lower capacitance state, which, in an example embodiment, may comprise approximately zero (or very little) capacitance, and a higher capacitance state that is a function, at least in part, of a voltage applied across a CEM switch.

Figure 2:
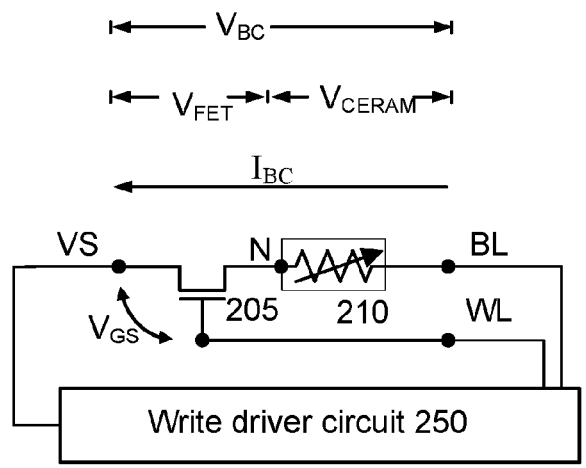
FIG. 2 is a schematic diagram of a bitcell utilizing a CES element according to an embodiment.

FIG. 2 is a schematic diagram of a bitcell circuit comprising a CES element according to an embodiment 200. In this context, a "bitcell" or "bitcell circuit" as referred to herein comprises a circuit, or a portion of a circuit, capable of representing a value, symbol, or parameter, as a state. For example, a bitcell may comprise one or more memory devices capable of representing a value, symbol, or parameter as a memory state of the memory device. In particular implementations, a bitcell may represent a value, symbol, or parameter as a single bit or multiple bits.

According to an embodiment, a read signal from a precharged bitline having a voltage V$_{BC}$ may apply a voltage across CES element 210 in a read operation as V$_{READ}$=V$_{BC}$−V$_{FET}$, where V$_{FET}$ is a voltage drop across FET 205. For example, V$_{READ}$ may comprise a voltage approximately in the range of 0.15 V to 0.4 V. It should be noted, however, that this is merely an example operating voltage provided for the purpose of illustrating aspects of particular embodiments and that claimed subject matter is not limited in this respect.

In the particular implementation of FIG. 2, FET 205 is configured as an NFET. FET 205 may be configured as a PFET in alternative implementations.

In one implementation, CES element 210 may be utilized by a CERAM device, or other type of non-volatile memory device, as a specific example of a device in a bitcell capable of maintaining an impedance state. However, it should be understood that these are merely example implementations. For example, it should be recognized a CES element adapted for purposes other than a non-volatile memory device or CERAM device may be used for storing a particular impedance state (e.g., a conductive or low impedance memory state, or an insulative or high impedance memory state) in a write operation which is detectable in a subsequent read operation, and that claimed subject matter is not limited to implementation of a CERAM or other type of non-volatile memory device.

According to an embodiment, an impedance state of a CES element in a bitcell may be changed or determined based on a particular voltage and current applied to a bitline. In this context, a "bitline" comprises a conductor that is capable of being coupled to at least one terminal of a memory element during a write operation to transmit a programming signal altering a memory state of the memory element, or during a read operation to transmit a signal indicative of a current memory state of the memory element. For example, providing a signal to bitline BL having a voltage $V_{RESET}$ and a sufficient current $I_{RESET}$ may place CES element 210 of the bitcell of embodiment 200 into an insulative or high impedance memory state. Likewise, providing a signal to bitline BL having a voltage $V_{SET}$ and a sufficient current $I_{SET}$ may place a CES element 210 in a conductive or low impedance memory state.

In particular embodiments, a write operation is described as a particular process of placing a memory device, such as a CES element, into a particular impedance state of a plurality of impedance states by applying a "programming signal" to terminals of the memory device. Particular ones of the predetermined impedance states may correspond to particular voltage levels to be applied to the memory device (e.g., $V_{SET}$ and $V_{RESET}$). Similarly, particular ones of the predetermined impedance states may correspond to particular current levels to be applied to the memory device (e.g., $I_{SET}$ and $I_{RESET}$). Accordingly, in a particular embodiment, a programming signal to place a CES device in a particular impedance state in a write operation may be controlled to have a particular voltage level and current level corresponding to the particular impedance state.

In this context, a "conducting element" comprises a circuit element capable of permitting current to pass between, for example, an input node and an output node. In a particular implementation, a conducting element may vary a current permitted to pass between nodes based, at least in part, on a particular condition. The particular implementations described herein employ FETs as conducting elements to permit current to pass between source and drain terminals based, at least in part, on a voltage applied to a gate terminal ($V_{GS}$). It should be understood, however, that other types of devices such as, a bipolar transistor, diode, variable resistor, etc., may be used as a conducting element, and that claimed subject matter is not limited this respect. In this context, a conducting element having first and second terminals may "couple" the first and second terminals by providing a conductive path between the first and second terminals, wherein the conductive path comprises a small or negligible impedance for a particular signal. In one particular example implementation, a conducting element may vary an impedance between the first and second terminals based, at least in part, on a signal provided to a third terminal of the conducting element (e.g., a based on a voltage or current applied to the third terminal). In one aspect, a conducting element may "close," or least partially close, to thereby electrically couple first and second terminals in response to a signal provided on the third terminal. Likewise, a conducting element may "open" to thereby decouple first and second terminals in response to a different signal provided at the third terminal. In one aspect, a conducting element in an open state may decouple or even isolate a first portion of a circuit from a second portion of the circuit by removing or disrupting a conductive path between the first and second portions of the circuit. In another aspect, a conducting element may vary an impedance between first and second terminals between an open, partially closed, and closed state based on a signal provided to a third terminal.

In a particular implementation of a read operation, bitline BL of the bitcell circuit of FIG. 2 may be coupled to a terminal of a CES element through a first conducting element in response to a voltage signal on wordline WL. In this context, a "wordline" comprises a conductor for transmitting a signal to select a particular bitcell, or group of bitcells, to be accessed in a read operation or in a write operation. In a particular example implementation, a voltage of a signal on a wordline may be raised or lowered to select or deselect a particular bitcell or group of bitcells to be coupled to a corresponding bitline or group of bitlines during a read or write operation. It should be understood, however, that this is merely an example of a wordline and that claimed subject matter is not limited in this respect.

In one aspect of the particular embodiment of FIG. 2, CES element 210 may be coupled to FET 205 at a first terminal (N) and to bitline BL at a second terminal. In response to a wordline voltage applied to a gate terminal of FET 205, FET 205 may couple the first terminal of CES element 210 to voltage source VS during read or write operations. In write operations, bitline BL may be biased to apply an appropriate voltage (e.g., $V_{SET}$ or $V_{RESET}$ as shown in FIG. 1A) and current (e.g., $I_{SET}$ or $I_{RESET}$ as shown in FIG. 1A) across first and second terminals of CES element 210 to place the element into a desired impedance state, or to apply an appropriate voltage (e.g., $V_{READ}$ as described in relation to FIG. 1A) in a read operation to detect an impedance state of CES element 210. In this particular example implementation, $BL_1$ may be coupled to write driver circuit 250, which may operate to control voltages of the bitcell of embodiment 200.

As pointed out above, a write circuit may independently control a voltage and a current of a signal applied to CES element 210 in a write operation based, at least in part, on whether the write operation is to place CES element 210 into a conductive or low impedance memory state (e.g., in a set operation), or an insulative or high impedance memory state (e.g., in a reset operation). For example, and as depicted in FIG. 1A, for a write operation to place CES element 210 in a conductive or low impedance memory state, a signal having a voltage $V_{SET}$ and current $I_{SET}$ may be applied. Likewise, for a write operation to place CES element 210 into an insulative or high impedance state, a signal having a voltage $V_{RESET}$ and current $I_{RESET}$ may be applied. Also as illustrated in FIG. 1A, voltage $V_{SET}$ may have a greater magnitude than voltage $V_{RESET}$ while current $I_{SET}$ (as indicated by $J_{SET}$ in FIG. 1A) may have a smaller magnitude than current $I_{RESET}$ (as indicated by $J_{RESET}$ in FIG. 1A). In a particular implementation, a write circuit (not shown) may independently control voltage and current to provide a signal to a bitline to place a non-volatile memory device into a conductive or low impedance memory state, or into an insulative or high impedance state.

In the embodiment of FIG. 2, to detect an impedance state, for example, during a read operation of CES element 210, FET 205 may couple voltage source VS and/or other peripheral read circuitry to node N to apply a read voltage $V_{READ}$ across first and second terminals of CES element 210. While read voltage $V_{READ}$ is applied, a current flowing through bitline BL to VS (e.g., through FET 205) may then be sensed. Such sensing may be performed via a sense amplifier not shown in FIG. 2 to detect an impedance state of CES element 210. According to an embodiment, a magnitude of a current flowing through terminals of CES element 210 during a read operation may be limited to less than the magnitude of $I_{RESET}$ (corresponding to $J_{RESET}$ in FIG. 1A). This may prevent an unintended transition of a current state of CES element 210 in a conductive or low impedance memory state to an insulative or high impedance memory state during a read operation.

Figure 3:
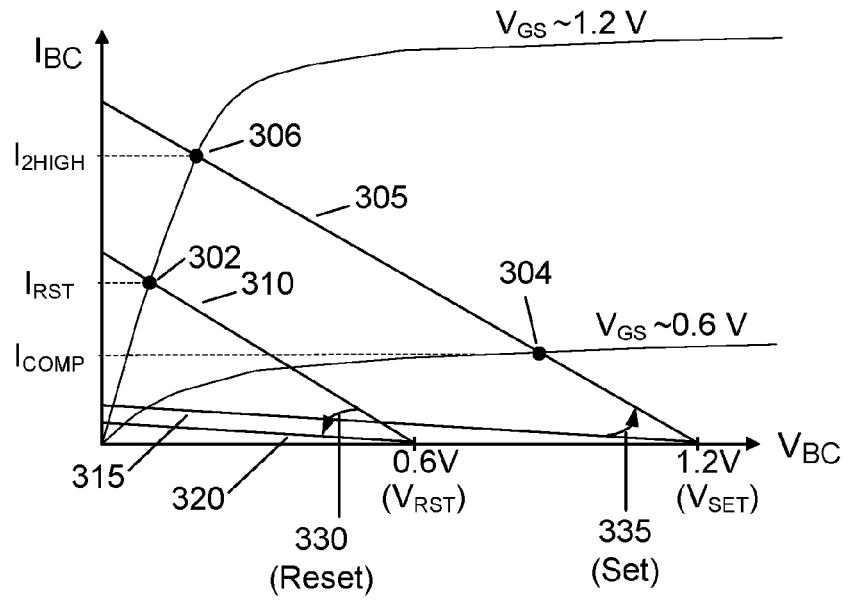
FIG. 3 is a graphical representation showing load lines superimposed on a current density versus voltage for a CES element according to an embodiment.

FIG. 3 is a graphical representation showing load lines superimposed on voltage versus current characteristics of a bitcell according to embodiment 300. Accordingly, for an example conducting element, such as FET 205 of the bitcell of embodiment 200 (of FIG. 2), a characteristic current profile is shown for a value of $V_{GS}$ of about 1.2 V and for a value of $V_{GS}$ of about 0.6 V. It should be noted that these values for $V_{GS}$ are merely for the purposes of illustration, and claimed subject matter is not limited to any particular values for $V_{GS}$. Additionally, it should be pointed out that a large number of characteristic current profiles are possible for conducting elements, such as FET 205 of the bitcell of embodiment 200, claimed subject matter is not limited in this respect. In embodiment 300, $V_{GS}$ may correspond to a wordline voltage, as described with reference to the bitcell of embodiment 200 of FIG. 2.

FIG. 3 also indicates load lines 305, 310, 315, and 320. In FIG. 3, load lines 305, 310, 315, and 320 correspond to constraints placed on a conducting element, such as FET 205 of the bitcell of embodiment 200, by the presence of CES element 210 coupled in series with the conducting element. In embodiment 300, load lines 305 and 310 correspond to constraints on current flow through a conducting element (e.g., FET 205) while CES element 210 is placed into a relatively conductive/lower impedance state. Load lines 315 and 320 correspond to constraints on current flow through a conducting element (e.g., FET 205) while CES element 210 is placed into a relatively insulative/higher impedance state. It may be appreciated that load lines 305, 310, 315, and 320 are depicted as straight lines, thus indicating a linear relationship between current and voltage representing an "ideal" linear resistor. However, in embodiments, CES elements, such as CES element 210, for example, may comprise nonlinear current/voltage characteristics. Accordingly, actual load lines encountered in particular embodiments may comprise lines of occasionally varying slope, curves, inflections points, and so forth.

As shown in FIG. 3, point 302 lies at the intersection of the characteristic current profile of $V_{GS}$ of about 1.2 V and load line 310. In addition, point 304 lies at the intersection of the characteristic current profile of $V_{GS}$ in the range of 0.6-0.7 V and load line 305. Further, point 306 lies at the intersection of the characteristic current profile of $V_{GS}$ of about 1.2 V and load line 305. Accordingly, points 302, 304, and 306 represent permitted values of voltage across a bitcell ($V_{BC}$), such as the bitcell of embodiment 200, for example, and current through a bitcell ($I_{BC}$), for example.

However, it should be noted that additional intersecting points of characteristic current profiles of $V_{GS}$ are possible, such as for $V_{GS}$ equals 0.8 V, 0.9 V, etc. (not shown in FIG. 3), and for load lines corresponding to additional values for $V_{BC}$, such as for $V_{BC}$ equal to 0.8 V, 0.9 V, etc. (also not shown in FIG. 3), and claimed subject matter is not limited in this respect. Thus, claimed subject matter is intended to embrace all load lines illustrating constraints placed on conducting elements coupled to CES elements.

In the embodiment 300 (of FIG. 3), to carry out a reset operation of a CES element, such as CES element 210 of FIG. 2, $V_{GS}$ may first be fixed to a value of about 1.2 V, and $V_{BC}$ may be increased from a reference voltage, such as about 0.0 V, to a reset voltage, such as about 0.6 V ($V_{RST}$). Under these conditions, if CES element 210 operates in the relatively low impedance/conductor state, the slope of load line 310 may comprise a value that approximates $(-1/R_{LO})$, in which $R_{LO}$ corresponds to the value of the resistance of CES element 210. Referring to FIG. 3, under conditions of relatively low values of $V_{BC}$ (e.g., less than about 0.6 V), a current $I_{RST}$, may be permitted to flow through CES element 210. In particular embodiments, $I_{RST}$ may comprise a value approximately 20.0% greater than $I_{COMP}$ ($I_{RST} \approx 1.2 * I_{COMP}$) while $V_{BC}$ does not exceed a value of about 0.6 V. Accordingly, to perform a reset operation of CES element 210, an increase in current flow from $I_{COMP}$ to $I_{RST}$ may represent a modest and feasible increase in current flow through CES element 210.

As shown in FIG. 3, as $V_{BC}$ is increased so as bring about a voltage across CES element 210 that approaches about 0.6 V, CES element 210 may undergo a Mott-like transition in which the CES element transitions from a relatively conductive/lower impedance state to a relatively insulative/higher impedance state, as shown by arrow 330 indicating a reset operation in FIG. 3. Responsive to CES element 210 being placed into a relatively insulative/higher impedance state, current flow through the CES element may be significantly reduced, such as in accordance with load line 320, which may comprise a slope of $(-1/R_{HI})$, in which $R_{HI}$ corresponds to the value of the resistance of CES element 210. It should be noted that claimed subject matter is intended to embrace all load lines illustrating constraints placed on conducting elements coupled to CES elements, such as any additional load lines having a slope of $-1/R_{LO}$ and $-1/R_{HI}$.

As $V_{BC}$ is further increased, so as to bring about a voltage across CES element 210 that approaches about 1.2 V, CES element 210 may undergo a Mott-like transition in which the CES element transitions from a relatively insulative/higher impedance state to a relatively conductive/lower impedance state, such as shown by arrow 335. As $V_{BC}$ decreases after occurrence of a Mott-like transition, current through CES element 210 may decrease, following, for example, the profile of $V_{GS}$ equal to about 0.6 V.

In particular embodiments, prior to CES element 210 undergoing a Mott-like transition, such as from a relatively insulative/higher impedance state to a relatively conductive/lower impedance (given by arrow 335 to indicate a set operation), $V_{GS}$ may be reduced from a voltage of about 1.2 V to a voltage of about 0.6 V. In certain embodiments, such lowering of $V_{GS}$ may reduce current flow through CES element 210 in a manner that advantageously inhibits current through the CES element from approaching point 306 ($I_{BC} = I_{2HIGH}$). In embodiments, inhibiting CES element 210 from approaching point 306, such as by inhibiting a current flow greater than $I_{COMP}$ while $V_{GS}$ is set to voltage equal to about 1.2 V. In certain embodiments, inhibiting current from approaching point 306, by way of exerting control over $V_{GS}$, for example, may safeguard against a condition in which a compliance current for a CES element is set to a level that may be difficult to overcome during a reset operation. To illustrate, referring to FIG. 3, if $V_{GS}$ were set to a voltage of about 1.2 V while $V_{BC}$ is set to $V_{SET}$ (about 1.2 V) a significantly high compliance current ($I_{2HIGH}$) may be permitted to flow through CES element 210. Thus, at least in particular embodiments, to reset a compliance current through CES element 210, a current even greater than $I_{2HIGH}$ may be required. However, at least in certain embodiments, current flow greater than $I_{2HIGH}$ may be difficult to achieve.

Accordingly, in particular embodiments, by reducing or lowering $V_{GS}$ to about 0.6 V, while a voltage across a CES element is increased to equal as much as about 1.2 V, a compliance current of a CES element may be set to a relatively low value, such as $I_{COMP}$. Accordingly, resetting a CES element, while $V_{BC}$ is set to equal about 0.6 V, setting $V_{GS}$ to equal about 1.2 V may give rise to only a modest increase in current ($I_{RST}$) through a CES element. However, in contrast, if $V_{GS}$ is set to equal a higher voltage, such as a voltage equal to about 1.2 V while a voltage across the CES element (e.g., $V_{BC}$) is set to about 1.2 V, a Mott transition may occur (as indicated by arrow 335) and the compliance current of the CES element may be set to a higher value, such as $I_{2HIGH}$. Accordingly, resetting a compliance current of the CES element may require a current higher than $I_{2HIGH}$, which may, at least in particular embodiments, be difficult or infeasible to supply.

Figure 4:
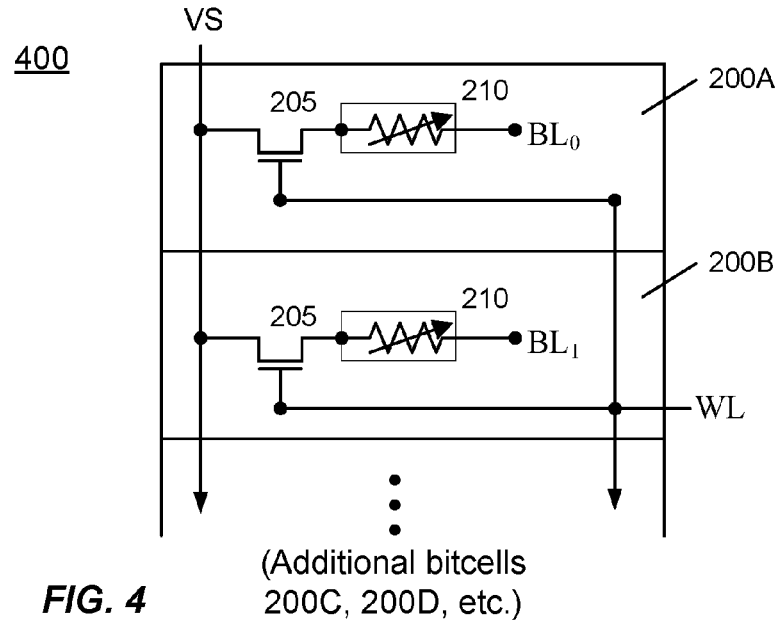
FIG. 4 is a schematic diagram of bitcells selectable for write operations from a single wordline voltage according to an embodiment.

FIG. 4 is a schematic diagram of bitcells selectable for write operations from a single wordline voltage according to an embodiment 400. In embodiment 400, raising wordline voltage WL applied to gate terminals of FETs 205 operates to couple CES elements of bitcells 200A and 200B to a common source voltage (VS) during read or write operations. In a particular implementation, common source voltage VS is coupled to a first terminal of multiple CES elements (e.g., all CES elements) of bitcells 200A, 200B, 200C, 200D, etc., coupled to wordline voltage WL. In this context, a "source voltage" comprises a particular voltage level such as, for example, a voltage "ground," that is maintained at a node in a circuit. In an implementation, a source voltage may be maintained by a particular circuit or power supply. For simplicity, FIG. 4 shows only two bitcells 200A and 200B coupled to wordline voltage WL. It should be understood, however, that wordline voltage WL may be coupled to a large number of bitcells coupled common source voltage VS to respect the first terminals of the CES elements comprising bitcells 200A, 200B, etc.

A second terminal of the CES element of bitcell 200A may be coupled, for example, to one or more write driver circuits, such as write driver circuit 250 of FIG. 2. According to an embodiment, bitcells capable of being coupled to common source voltage VS and responsive to wordline voltage WL, such as bitcells 200A, 200B, as well as additional bitcells, may be simultaneously accessed in write operations to place the individual bitcells into particular high/low impedance states. Based, at least in part, on one or more particular values to be represented or expressed in the bitcells, individual bitcells may be accessed for a set or reset operation as discussed above. To place individual bitcells, capable of being coupled to common source voltage VS responsive to wordline voltage WL, into first or second impedance states, bitcells 200A and 200B, as well as additional bitcells, may be simultaneously accessed in two phases of a single two-phase clock cycle: a first clock phase may place a first group of selected bitcells into a high impedance or insulative state, such as during a reset operation, and a second clock phase to place a second group of selected bitcells (different from the first group of selected bitcells) into a low impedance or conductive state, such as during a set operation. It should be understood, however, that actions performed in the first and second clock phases may be performed in a reverse order without deviating from claimed subject matter. For example, a phase of a single two-phase clock cycle may instead place a first group of selected bitcells into a low impedance or conductive state (e.g., a set operation); and a second clock phase to place a second set of selected bitcells (different from the first set of selected bitcells) into a high impedance or insulative state. According to an embodiment, the first set of selected bitcells and the second set of selected bitcells may or may not comprise mutually exclusive and exhaustively complete portions of bitcells, which are capable of being coupled to common source voltage VS responsive to wordline voltage WL.

In particular embodiments, wordline voltage WL may be modified, such as by way of write driver circuit 250 of FIG. 2, for example, to control the state of FET 205 or other type of conducting element in series with CES element 210. Thus, at times, write driver circuit 250 may provide a wordline voltage of, for example, about 0.0 V relative to common source voltage VS so as to place FET 205 into an open state, in which a negligibly small current, at most, is permitted to flow through FET 205. Accordingly, a present state of CES element 210, such as a relatively insulative/high impedance state or a relatively conductive/low impedance state, may be maintained.

At other times, write driver circuit 250 may provide a wordline voltage of, for example, about 0.6 V relative to common source voltage VS so as to place FET 205 into a partially closed state to permit more than a negligible current flow through FET 205. In this context, a conducting element may be placed into a "partially closed state," as referred to herein, under a particular condition (e.g., appropriately biased) to permit at least a magnitude of current greater than a negligible current to perform a particular circuit function, but substantially less than a maximum current magnitude through the conducting element while in a closed state (e.g., under different bias conditions). In an example of an implementation, while in a partially closed state, FET 205 may perform a set operation on CES element 210 (as shown at point 304 of FIG. 3). At still other times, write driver 250 may provide wordline voltage of, for example, about 1.2 V relative to common source voltage VS so as to place FET 205 into a closed state. In a closed state, FET 205 may perform a reset operation on CES element 210 (as shown at point 302 of FIG. 3).

Figure 5:
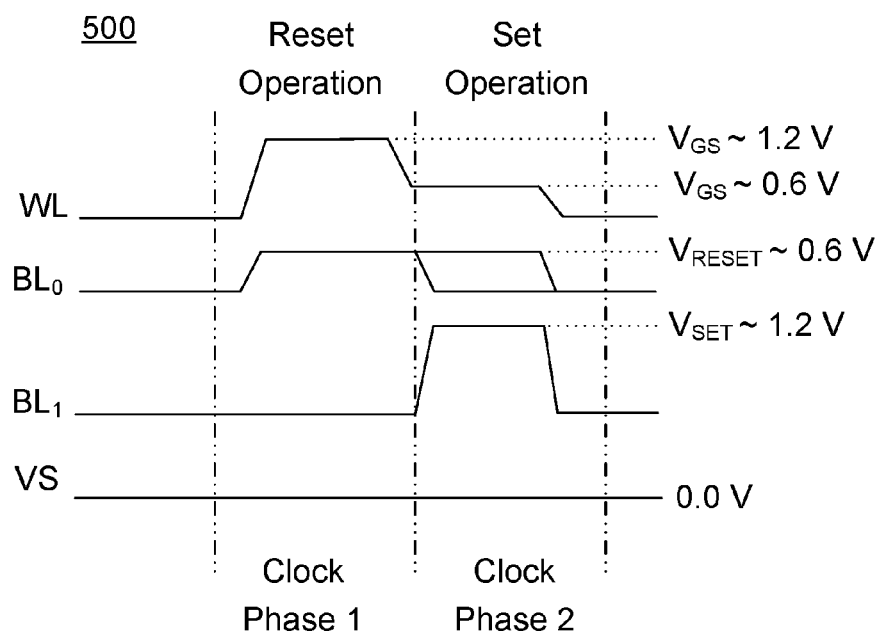
FIG. 5 is a signal timing diagram illustrating timing of signals applied to a CES element in a bitcell according to an embodiment.

FIG. 5 is a signal timing diagram illustrating timing of signals applied to a CES device in a bitcell according to an embodiment 500. In a particular example implementation, the bitcell may be one of multiple bitcells capable of being coupled to common source voltage VS responsive to a voltage signal coupled to wordline voltage WL, such as described with reference to bitcells 200A and 200B of FIG. 4. In a first phase of a single two-phase clock cycle (clock phase 1), a first set of selected bitcells, for example, among bitcells 200A, 200B, 200C, 200D, etc., may be placed into a high impedance/insulative state, such as responsive to a reset operation of the first set of selected bitcells. In a second phase of a single two-phase clock cycle (clock phase 2) a second set of selected bitcells (e.g., different from the first set of selected bitcells) may be placed into a low impedance or conductive state, such as in a set operation of the second set of selected bitcells. As may be observed, for bitcells capable of coupling to common source voltage VS and responsive to wordline voltage WL, wordline voltage WL may be maintained at a first voltage in a first phase of a single clock cycle and lowered to a second voltage in a second phase of a single clock cycle. In embodiments, such as that of FIG. 5, maintaining wordline voltage WL at a first voltage, such as during clock phase 1 ($V_{GS}$ equal to about 1.2 V), may place a conducting element into an at least partially or completely closed state. Maintaining wordline voltage WL at a second voltage, such as during clock phase 2 ($V_{GS}$ equal to about 0.6 V as shown in FIG. 5), may place a conducting element into an at least partially closed state. Bitline BL, of FIG. 5, may be coupled to a particular bitcell and to a particular voltage during the first phase (clock phase 1), or during the second phase (clock phase 2), based, at least in part, on whether a CES element of the bitcell is to be placed into a high impedance or insulative state, placed into a low impedance or conductive state, or is to be maintained in the present impedance state.

In the particular example of FIG. 5, bitcells capable of being coupled to common source voltage VS responsive to wordline voltage WL may be accessed in clock phases 1 and 2. Prior to initiation of clock phase 1, as shown at the left portion of FIG. 5, wordline voltage WL may be set or coupled to a reference voltage, such as a voltage of about 0.0 V. Consequently, conducting elements, such as FETs 205 of FIG. 4, may be placed in an open state, in which only a small or negligible current (at most) is permitted to flow through bitcells 200A, 200B, 200C, 200D, etc. Accordingly, under such conditions, a voltage coupled to bitlines $BL_0$ and $BL_1$ would be unlikely to bring about a change in an impedance state of one or more of CES elements 210. Also as shown at the left portion of FIG. 5, common source voltage VS may be maintained at a reference voltage, such as 0.0 V, for example.

In one example, to perform a reset operation of bitcell 200A, such as at clock phase 1, a voltage applied to bitline $BL_1$ may be maintained at the same, or approximately the same, voltage as common source voltage VS, thus corresponding to 0.0 V applied across terminals of a CES element coupled to bitline $BL_1$. Accordingly, the impedance state of CES element 210 of bitcell 200B may remain unchanged. Also at clock phase 1, a voltage applied to bitline $BL_0$ may be raised to approach a voltage at which CES element 210 of bitcell 200A may be capable of undergoing a reset operation, such as a value equal to about 0.6 V (as described with reference to FIG. 3). To complete the reset operation of CES element 210 of bitcell 200A at clock phase 1, wordline voltage WL (which corresponds to $V_{GS}$ of FIG. 3) may be set equal to about 1.2 V to place a conducting element (e.g., FET 205) into a closed or at least partially closed. Accordingly, referring again to FIG. 3, a transition from a relatively low impedance/conductive state to a relatively high impedance/insulative state of a CES element (e.g., a reset operation as indicated at arrow 330 on FIG. 3) may occur.

In clock phase 2, common source voltage VS may be maintained at a reference voltage, such as 0.0 V, for example. A voltage applied to bitline $BL_1$ may be raised to approach a voltage at which a CES element may be capable of undergoing a set operation, which may correspond to $V_{BC}$ equal to about 1.2 V, as described with reference to FIG. 3. To complete the set operation of $BL_1$, wordline voltage WL (e.g., $V_{GS}$ of FIG. 3) may be reduced to equal about 0.6 V to place a conducting element (e.g., FET 205) into a partially closed state. Accordingly, as described with reference to FIG. 3, such a reduction in wordline voltage WL from about 1.2 V to about 0.6 V, while $BL_1$ is set equal to about 1.2 V, prohibits a compliance current, such as a compliance current of $I_{2HIGH}$, from flowing through a CES element. Accordingly, a condition in which resetting a compliance current of a CES element may require a current higher than $I_{2HIGH}$, which may be difficult or infeasible to supply, may be avoided.

Responsive to operations and clock phase 1, in which CES element 210 of $BL_0$ is set to a relatively insulative/high impedance state, any value between about 0.0 V and about 0.6 V may be applied to $BL_0$ to maintain CES element 210 of $BL_0$ in the relatively high impedance/insulative state. In embodiments, responsive to $BL_0$ being placed into a relatively insulative/high impedance state, an applied voltage remaining below about 0.6 V, for example, is not of sufficient magnitude to transition CES element 210 coupled to $BL_0$ from a relatively conductive/low impedance state to a relatively insulative/high impedance state.

Accordingly, as shown and described with respect to FIGS. 4 and 5, conducting elements (e.g., FETs 205) of bitcells 200A and 200B may be placed into an at least partially closed state, continuously, during the reset and set operations occurring at clock phase 1 and 2. For the example of FIG. 5, at a first clock phase, raising wordline voltage WL to equal about 1.2 V, while a reference voltage is applied to VS, brings about a closed state of FETs 205 of bitcells 200A and 200B. At a second clock phase, lowering wordline voltage WL to equal about 0.6 V, while a reference voltage is applied to VS, brings about a partially closed state of FETs 205 of bitcells 200A and 200B. As may be observed, maintaining FETs 205 in at least a partially closed state during clock phases 1 and 2 may enable performing clock phases 1 and 2, and therefore write operations in phases 1 and 2, in a single clock cycle of a clock signal controlling access to bitcells 200.

Figure 6:
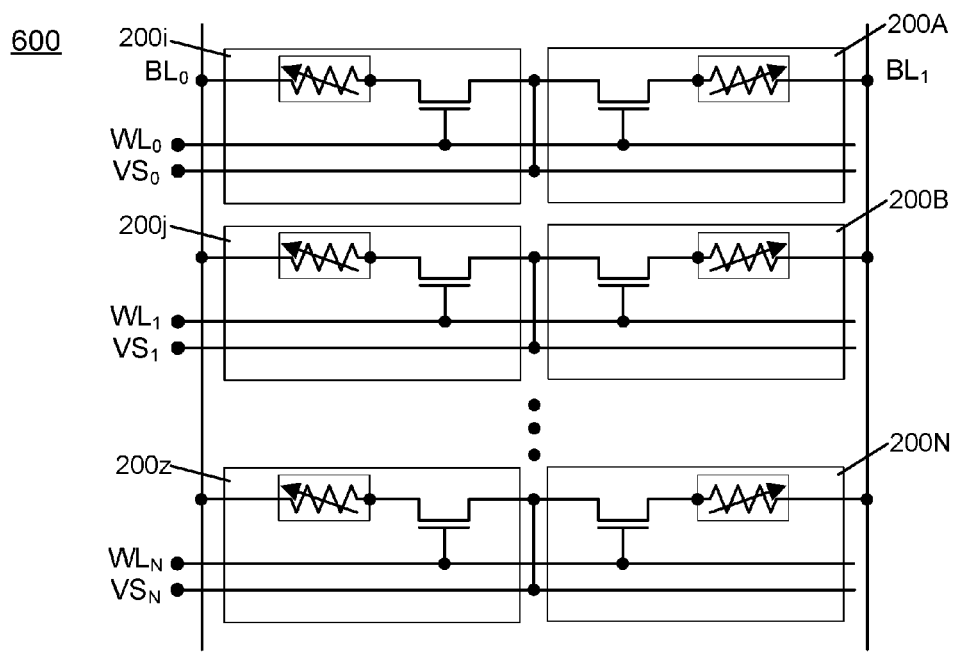
FIG. 6 is a schematic diagram of an arrangement of bitcells selectable for write operations according to an embodiment.

FIG. 6 is a schematic diagram of an arrangement of bitcells selectable for write operations according to an embodiment 600. In FIG. 6, common source voltage (VS) nodes, such as $VS_0$, $VS_1$, . . . , $VS_N$, are shown as being coupled to a row of bitcells. For example, $VS_0$ is shown as being coupled to bitcells 200i and 200A. Additionally, $VS_1$ is shown as running across bitcells 200j and 200B. Further, $VS_N$ is shown as being coupled to 200z and 200N. Likewise, wordlines are shown as providing access across multiple bitcells, such as $WL_0$ coupling to the gates of the conducting elements of bitcells 200i and 200A. Additionally, $WL_1$ is shown as coupling to the gates of the conducting elements of bitcells 200j and 200B, and $WL_N$ is shown as coupling to the gates of the conducting elements of bitcells 200z and 200N. Also shown in FIG. 6, $BL_0$ and $BL_1$ are shown as providing access in a vertical direction, such as $BL_0$ providing access to bitcells 200i, 200j, and 200z. Similarly, $BL_1$ is shown as providing access to bitcells 200A, 200B, and 200N.

Figure 7:
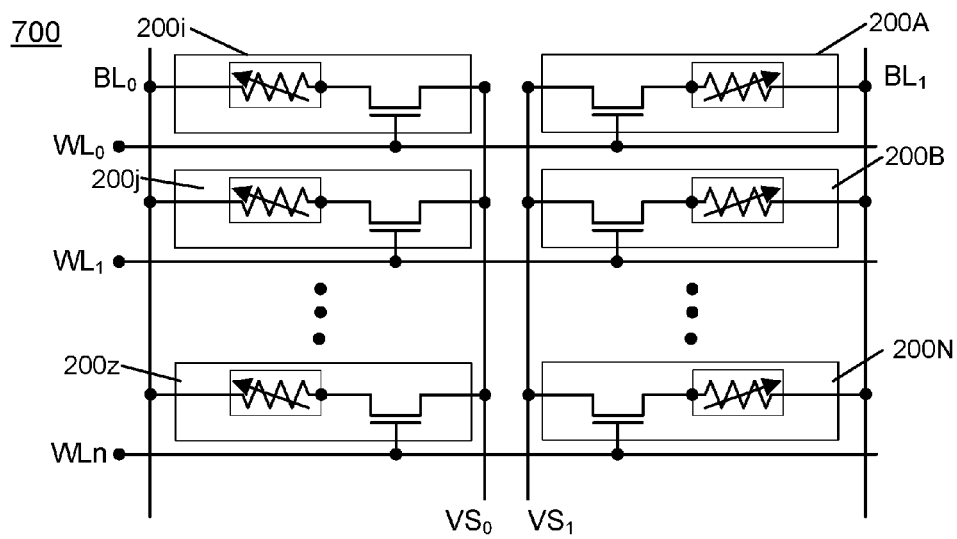
FIG. 7 is a schematic diagram of an arrangement of bitcells selectable for write operations according to an embodiment.

FIG. 7 is a schematic diagram of an arrangement of bitcells selectable for write operations according to an embodiment 700. In embodiment 700, bitcells are shown as organized with VS nodes providing access in a vertical direction, as opposed to the horizontal arrangement of VS nodes of FIG. 6. Accordingly, $VS_0$ provides access to bitcells 200i, 200j, and 200z and $VS_0$ provides access to bitcells 200A, 200B, and 200C. As in FIG. 7, $BL_0$ and $BL_1$ as well as $WL_0$ and $WL_1$ are shown as providing access in a horizontal direction.

Figure 8:
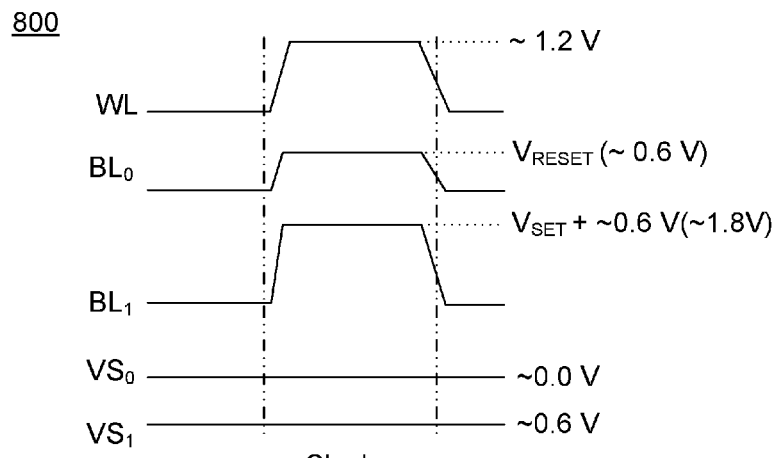
FIG. 8 is a signal timing diagram illustrating timing of signals applied to an arrangement of bitcells according to an embodiment 800.

FIG. 8 is a signal timing diagram illustrating timing of signals applied to an arrangement of bitcells according to an embodiment 800. Embodiment 800 may be suitable for use with the arrangement of bitcells selectable for write operations of embodiment 700 (FIG. 7) although claimed subject matter is not limited to any particular arrangement of bitcells. The timing diagram of embodiment 800 may operate to perform a reset operation (e.g., relatively high impedance/insulative state) of bitcells 200$i$, 200$j$, through 200$z$ and to perform a set operation (e.g., relatively low impedance/conductive state) of bitcells 200A, 200B, through 200Z. It should be noted that the aforementioned second reset operations may be performed utilizing a single phase of a clock cycle.

Beginning with the lower portion of FIG. 8, $VS_1$ may be raised from a reference voltage to a value equal to about 0.6 V while $VS_0$ remains at a reference voltage. Under these voltage conditions for $VS_1$ and $VS_0$, wordlines corresponding to a row of the arrangement of embodiment 700, such as $WL_0$, are raised to a value of about 1.2 V to bring about an at least partially closed or completely closed state of conducting elements of bitcells 200$i$ and 200A. Thus, with $BL_0$ raised to about 0.6 V, and $VS_0$ set to a reference voltage, sufficient current may flow through bitcell 200$i$ to perform a reset operation (corresponding to arrow 330 of FIG. 3). In response, bitcell 200$i$ may be placed into a relatively high impedance/insulative state.

Responsive to raising $VS_1$ to about 0.6 V and $BL_1$ to a value that approximates $V_{SET}$+0.6 V (about 1.8 V) the voltage difference across bitcell 200A, 200B, through 200N may comprise an approximately constant voltage difference of about 1.2 V (e.g., about 1.8 V–$VS_1$). In addition, with $WL_0$ comprising voltages of about 1.2 V, the gates of the conducting element of bitcell 200A comprises about 0.6 V (1.2 V–0.6 V), thus placing the conducting element into an at least partially closed state. Accordingly, the bitcell 200A may undergo a set operation (corresponding to arrow 335 on FIG. 3).

Accordingly, as shown and described with respect to the embodiments of FIGS. 7-8, conducting elements of one or more of bitcells 200$i$, 200$j$, ..., and 200$z$ as well as 200A, 200B, ..., and 200N, for example, may be placed into an at least partially closed state, continuously, during the reset and set operations occurring at clock phase 1. For the example of FIG. 8, at a first clock phase, raising wordline voltage WL to equal about 1.2 V, while a reference voltage is applied to $VS_0$, brings about a closed state of the conducting elements of bitcells 200$i$-200$z$. In addition, and also at a first clock phase in which wordline WL is raised to a voltage of about 1.2 V, applying a voltage of about 0.6 V to $VS_1$ brings about a partially closed state of conducting elements controlling access bitcells 200A-200N in write operations. Again, as pointed out above, conducting elements controlling access to bitcells 200A-200N in an at least partially closed state during clock phases 1 and 2 may enable performing clock phases 1 and 2, and therefore write operations in phases 1 and 2, in a single clock cycle of a clock signal controlling access to bitcells 200A-200N.

In other embodiments, the bitcell arrangement of embodiment 700 (FIG. 7) may be utilized with a number of additional combinations of wordline voltages (e.g., $WL_0$, and $WL_1$) to place conducting elements into at least partially closed or completely closed states. In addition, bitline voltages (e.g., $BL_1$, $BL_0$) and common source voltages (e.g., $VS_1$ and $VS_0$) may also undergo appropriate modifications. At least some of the possible combinations of wordline voltages, bitline voltages, and common source voltages are described in Table 2, below:

TABLE 2

| Node | System A | System B | System C |
|---|---|---|---|
| Wordline (WL) | 1.2 V | 0.9 V | 0.9 V |
| Bitline for Reset Operation ($BL_0$) | 0.6 V | 0.3 V | 0.9 V |
| Bitline for Set Operation ($BL_1$) | 1.8 V | 1.5 V | 1.5 V |
| Common Source Voltage ($VS_0$) | 0.0 V | −0.3 V | 0.0 V |
| Common Source Voltage ($VS_1$) | 0.6 V | 0.3 V | 0.3 V |

In Table 2 above, the identified Systems "A," "B," and "C" may each refer to a number of embodiments, which may utilize the arrangement of embodiment 700, for example, or may utilize other arrangements, and claimed subject matter is not limited in this respect. Regarding System "A," particular advantages may include utilization of an easily available reference voltage, such as 0.0 V. Accordingly, in a particular embodiment, only three power supplies may be required; however, in other embodiments, up to four power supplies may be required. Regarding System "B," particular advantages may include use of lower voltage ranges during operation, such as 1.5 V. However, in particular embodiments, an additional power supply (such as four or five power supplies) may be required than would be required if System "A" were implemented. Regarding System "C," particular advantages may include utilization of an easily available reference voltage, such as 0.0 V. Thus, in a particular embodiment, three power supplies may be required; however, in other embodiments, up to four power supplies may be required.

Figure 9:
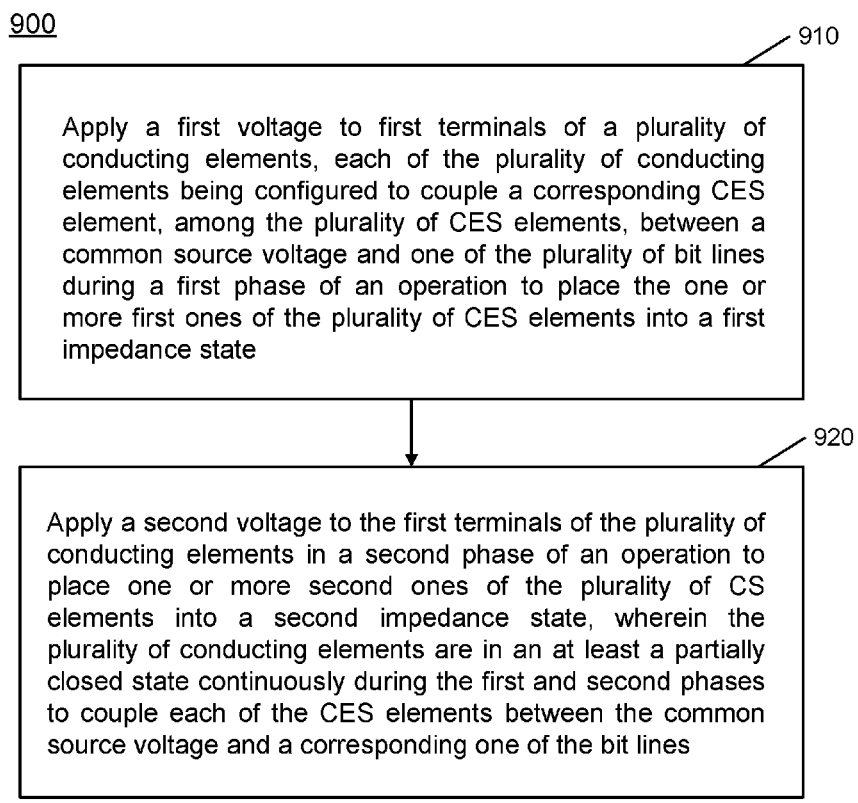
FIGS. 9-10 are flowcharts for methods of operating a memory device using a CES element according to embodiments.

FIG. 9 is a flowchart for a method of operating a memory device using a CES element according to an embodiment 900. Example implementations, such as described in FIG. 9, and any other figures described herein, may include blocks in addition to those shown and described, fewer blocks or blocks occurring in an order different than may be identified, or any combination thereof. The method may begin at block 910, which may comprise applying a first voltage to first terminals of a plurality of conducting elements, in which one or more first ones of the conducting elements are configured to couple one or more first CES elements between a first bitline voltage and a first common source voltage. Also at block 910, one or more second ones of the conducting elements may be configured to couple one or more second CES elements between a second bitline voltage and a second common source voltage. The method of FIG. 9 may continue at block 920, which may comprise applying a second voltage to the first terminals of the plurality of conducting elements in a second phase of operation took place one or more second ones of the plurality of CES elements into a second impedance state. At block 920, the plurality of conducting elements may be at least partially closed during the first and second phases to couple each of the CES elements between the common source voltage and a corresponding one of the bit lines.

Figure 10:
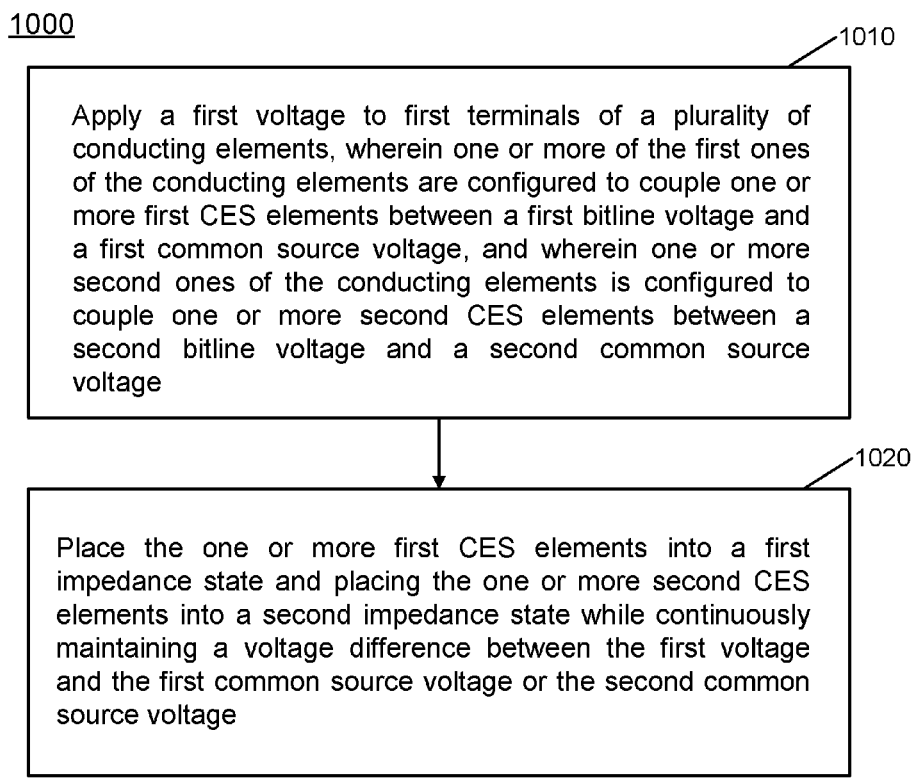

FIG. 10 is a flowchart for a method of operating a memory device using a CES element according to an embodiment 1000. The method of FIG. 10 may begin at block 1010, which may comprise applying a first voltage to first terminals of a plurality of conducting elements, wherein one or more of the first ones of the conducting elements are configured to couple one or more first CES elements between a first bitline voltage and a first common source voltage. Also at block 1010, one or more second ones of the conducting elements may be configured to couple one or more second CES elements between a second bitline voltage and a second common source voltage. The method of FIG. 10 may continue at block 1020, which may comprise placing the one or more first CES elements into a first impedance state and placing the one or more second CES elements into a second impedance state while continuously maintaining a voltage difference between the first voltage and the first common source voltage or the second common source voltage.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

In the preceding description, various aspects of claimed subject matter have been described. For purposes of explanation, specifics, such as amounts, systems, and/or configurations, as examples, were set forth. In other instances, well-known features were omitted and/or simplified so as not to obscure claimed subject matter. While certain features have been illustrated and/or described herein, many modifications, substitutions, changes, and/or equivalents will occur to those skilled in the art. It is, therefore, to be understood that the appended claims are intended to cover all modifications and/or changes as fall within claimed subject matter.

What is claimed is:

1. A method comprising:
   applying a first voltage to first terminals of a plurality of conducting elements, each of the plurality of conducting elements being configured to couple a corresponding correlated electron switch (CES) element of a plurality of CES elements, between a common source voltage and one of a plurality of bitlines during a first phase of an operation to place one or more first ones of the plurality of CES elements into a first impedance state; and
   applying a second voltage to the first terminals of the plurality of conducting elements during a second phase of the operation to place one or more second ones of the plurality of CES elements into a second impedance state, wherein the second voltage applied to the first terminals of the plurality of conducting elements is selected to limit current to determine a condition of a current density in the one or more second ones of the plurality of CES elements for a subsequent operation to place the one or more second ones of the plurality of CES elements into a high-impedance or insulative state,
   wherein the plurality of conducting elements are in an at least partially closed state continuously during the first and second phases to couple each of the CES elements between the common source voltage and a corresponding one of the plurality of bitlines.

2. The method of claim 1, and further comprising:
   maintaining a voltage difference between the common source voltage and the first voltage and between the common source voltage and the second voltage to limit current and voltage applied to the first terminals of the plurality of conducting elements during the first and second phases to maintain the plurality of conducting elements in the at least partially closed state during the first and second phases.

3. The method of claim 2, and further comprising:
   maintaining the voltage difference between the common source voltage and the second voltage to limit current in the one or more second ones of the plurality of CES elements.

4. The method of claim 3, and further comprising:
   changing a voltage on one or more bitlines of the plurality of bitlines coupled to the second ones of the plurality of CES elements following a change in the voltage difference between the common source voltage and the second voltage.

5. The method of claim 3, wherein the current in the one or more second ones of the plurality of CES elements corresponds to a compliance current to determine the condition of the current density for the subsequent operation to place the one or more second ones of the plurality of CES elements into the high-impedance or insulative state.

6. The method of claim 1, wherein the first impedance state comprises a high-impedance or insulative state, and the second impedance state comprises a low-impedance or conductive state.

7. The method of claim 1, wherein the first impedance state comprises a low-impedance or conductive state, and the second impedance state comprises a high-impedance or insulative state.

8. The method of claim 1, and further comprising:
   changing a voltage on one or more bitlines of the plurality of bitlines coupled to the one or more second ones of the plurality of CES elements following application of the second voltage to the first terminals of the plurality of conducting elements.

9. The method of claim 1, wherein the first and second phases occur during a single clock cycle.

10. A method comprising:
    applying a first voltage to first terminals of a plurality of conducting elements, one or more first ones of the plurality of conducting elements being configured to couple one or more first correlated electron switch (CES) elements between a first bitline voltage and a first common source voltage, one or more second ones of the plurality of conducting elements being configured to couple one or more second CES elements between a second bitline voltage and a second common source voltage; and
    limiting a current in the one or more first CES elements to determine a condition of a current density in the one or more second ones of the plurality of CES elements for a subsequent operation to place the one or more second ones of the plurality of CES elements into a relatively high-impedance or insulative state,
    wherein the one or more first CES elements are placed into a first impedance state and the one or more second CES elements are placed into a second impedance state while continuously maintaining an approximately constant voltage difference between the first bitline voltage and the first common source voltage or the second common source voltage.

11. The method of claim 10, wherein the one or more first ones of the plurality of conducting elements and the one or more second ones of the plurality of conducting elements are maintained in a partially closed state.

12. The method of claim 10, wherein the approximately constant voltage difference between the first voltage and the first common source voltage or the second common source voltage is continuously maintained to limit the current in the one or more second CES elements.

13. The method of claim 12, wherein the current in the one or more second ones of the plurality of CES elements corresponds to a compliance current to determine a condition of a current density for the subsequent operation to place the one or more second ones of the plurality of CES elements into the relatively high-impedance or insulative state.

14. The method of claim 10, further comprising:
    changing the voltage between the second bitline and the second common source following a change in the approximately constant voltage difference between the common source voltage and the first terminals of the one or more second ones of the plurality of conducting elements.

15. The method of claim 10, wherein the first impedance state comprises a high-impedance or insulative state, and the second impedance state comprises a low-impedance or conductive state.

16. The method of claim 10, wherein the first impedance state comprises a low-impedance or conductive state, and the second impedance state comprises a high-impedance or insulative state.

17. The method of claim 10, further comprising:
changing a voltage on bitlines coupled to the one or more second CES elements following application of a second voltage to the first terminals of the plurality of conducting elements.

18. A device comprising:
a plurality of bitcells, each of the bitcells comprising a first terminal coupled to a common source voltage and a second terminal coupled to a bitline corresponding to a memory element of the plurality of bitcells; and
a driver circuit to apply a first voltage to first terminals of conducting elements of each of the plurality of bitcells, the conducting elements being configured to couple a corresponding correlated electron switch (CES) element of each of the plurality of bitcells, among a plurality of CES elements, between a common source voltage and the bitline corresponding to a memory element in a first phase of an operation to place one or more of the plurality of CES elements into a first impedance state; and
the driver circuit to apply a second voltage to the first terminals of the conducting elements of each of the plurality of bitcells in a second phase of the operation to place one or more second ones of the plurality of CES elements into a second impedance state, the second voltage to apply to the first terminals of the conducting elements to be selected to limit current to determine a condition of a current density in the one or more second ones of the plurality of CES elements for a subsequent operation to place the one or more second ones of the plurality of CES elements into a relatively high-impedance or insulative state,
wherein the conducting elements of each of the plurality of bitcells are at least partially closed during the first and second phases to couple each of the CES elements between the common source voltage and the bitline corresponding to the memory element.

19. The device of claim 18, wherein the first impedance state comprises a high-impedance or insulative state, and the second impedance state comprises a low-impedance or conductive state.

20. The device of claim 18, wherein the first impedance state comprises a low-impedance or conductive state, and the second impedance state comprises a high-impedance or insulative state.

21. The device of claim 18, wherein the driver circuit is additionally to maintain a voltage difference between the common source voltage and the second voltage so as to limit compliance current in the one or more second ones of the plurality of CES elements during the subsequent operation.

\* \* \* \* \*